US005912901A

United States Patent [19]
Adams et al.

[11] Patent Number: 5,912,901
[45] Date of Patent: Jun. 15, 1999

[54] METHOD AND BUILT-IN SELF-TEST APPARATUS FOR TESTING AN INTEGRATED CIRCUIT WHICH CAPTURE FAILURE INFORMATION FOR A SELECTED FAILURE

[75] Inventors: R. Dean Adams, Essex Junction; Michael R. Ouellette, Westford, both of Vt.; Ronald J. Prilik, Chesterfield, Va.

[73] Assignee: International Business Machines Corporation, Armonk, N.Y.

[21] Appl. No.: 08/823,446

[22] Filed: Mar. 24, 1997

Related U.S. Application Data

[63] Continuation of application No. 08/529,842, Sep. 18, 1995, abandoned.

[51] Int. Cl.$^6$ ................................................. G01R 31/28
[52] U.S. Cl. ........................... 371/22.5; 371/22.6; 371/27
[58] Field of Search ............................... 371/22.5, 22.6, 371/22.4, 22.3, 24, 27, 5.1, 5.2, 21.1, 21.2, 67.1; 365/201; 324/158.1, 73.1

[56] References Cited

U.S. PATENT DOCUMENTS

| | | | |
|---|---|---|---|
| 4,404,519 | 9/1983 | Westcott | 324/73 R |
| 4,414,665 | 11/1983 | Kimura et al. | 371/21.1 |
| 4,549,295 | 10/1985 | Purvis | 371/21.1 |
| 4,769,761 | 9/1988 | Downes et al. | 364/514 |
| 4,841,485 | 6/1989 | Prilik et al. | 365/201 |
| 4,872,168 | 10/1989 | Aadsen et al. | 371/21.3 |
| 4,962,500 | 10/1990 | Sakagawa | 371/24 |
| 4,972,144 | 11/1990 | Lyon et al. | 324/158 R |
| 5,051,996 | 9/1991 | Bergeson et al. | 371/22.4 |
| 5,132,635 | 7/1992 | Kennedy | 324/158 R |
| 5,132,973 | 7/1992 | Obermeyer | 371/21.1 |
| 5,138,619 | 8/1992 | Fasang et al. | 371/21.1 |
| 5,173,906 | 12/1992 | Dreibelbis et al. | 371/22.5 |
| 5,301,156 | 4/1994 | Talley | 365/201 |
| 5,301,197 | 4/1994 | Yamede et al. | 371/5.1 |
| 5,351,232 | 9/1994 | Yamashita | 370/14 |
| 5,381,087 | 1/1995 | Hirano | 324/158.1 |
| 5,383,195 | 1/1995 | Spence et al. | 371/22.5 |

OTHER PUBLICATIONS

Jaber, T., "AC Array . . . ," IBM Tech. Disclosure Bulletin, vol. 35, No. 1B, Jun. 1992.
Jabor, T.K., "Array Built–In . . . ," IBM Tech. Disclosure Bulletin, vol. 34, No. 1, Jun. 1991.
AK Williams, T.W., "High–Speed, Low . . . " IBM Tech. Disclosure Bulletin, vol. 23, No. 8, Jan. 1981.

*Primary Examiner*—Hoa I. Nguyen
*Attorney, Agent, or Firm*—William P. Skladony; Brian F. Russell; Andrew J. Dillon

[57] ABSTRACT

A built-in self-test (BIST) apparatus and method for testing an integrated circuit are disclosed which enable capture of failure data for a selected failure. The BIST apparatus comprises a clock generator, which generates at least a first clock signal, and a built-in self-tester, which applies predetermined input data patterns to the integrated circuit in response to the first clock signal. In addition, the BIST apparatus includes a data comparator for comparing output data received from the integrated circuit with expected output data. The data comparator detects a failure within the integrated circuit when the output data received from the integrated circuit differs from the expected output data. The BIST apparatus further includes a clock controller that disables the first clock signal in response to the detection of a selected occurrence of a failure. By enabling testing of the integrated circuit to be halted upon the occurrence of a selected failure, failure analysis of the integrated circuit is enhanced.

11 Claims, 3 Drawing Sheets

METHOD AND BUILT-IN SELF-TEST APPARATUS FOR TESTING AN INTEGRATED CIRCUIT WHICH CAPTURE FAILURE INFORMATION FOR A SELECTED FAILURE

This is a continuation of application Ser. No. 08/529,842, filed Sep. 18, 1995, now abandoned.

BACKGROUND OF THE INVENTION

1. Technical Field

The present invention relates in general to a method and apparatus for testing an integrated circuit and more particularly to a built-in self-test apparatus and method for testing an integrated circuit. Still more particularly, the present invention relates to a built-in self-test apparatus and method for testing an integrated circuit which capture failure information for a selected failure.

2. Description of the Related Art

As integrated circuit technology has advanced, the complexity and density of circuit devices formed within a single chip has increased dramatically. Consequently, several problems have arisen with regard to testing such integrated circuits. For example, while the methodology for testing a memory array may be relatively straight forward, memory array chips typically have far fewer I/O pins available to a circuit tester than are required to adequately test the memory array.

A general solution to the above-described problem is to imbed test circuitry on the chip itself. Such testing facilities are frequently referred to as built-in self-test (BIST), array self-test (AST), or array built-in self-test (ABIST) circuits and will hereinafter be referred to generically as BIST circuits. With reference now to FIG. 1, there is illustrated a conventional closed-loop testing apparatus for an integrated circuit memory. As illustrated, integrated circuit (IC) 10, which includes BIST 12 and memory array 18, is coupled to IC tester 14 in a closed-loop fashion. That is, the enable/disable state of clock signal 16 is determined by feedback provided to IC tester 14 via diagnostic output (DGO) signal 20. According to the conventional BIST testing methodology, IC tester 14 scans data into BIST 12 to initialize a number of state machine latches. Then, in response to clock signal 16, BIST 12 applies internally generated test data and address data to memory array 18 and compares output data read out from memory array 18 with expected data. In response to a discrepancy between the output data and the expected data, BIST 12 indicates that a failure within memory array 18 has been detected by driving diagnostic output (DGO) signal 20 high. In response to receipt of DGO signal 20, IC tester 14 disables clock signal 16, thereby halting the state machine within BIST 12 that applies test data and address data to memory array 18. IC tester 24 then scans out the information within the state machine latches of BIST 12. Utilizing an algorithm, IC tester 14 determines the cycle in which the failure occurred from the state the state machine information and reinitializes BIST 12. Thereafter, BIST 12 is again run to the cycle in which the failure occurred by applying clock signal 16 for the appropriate number of cycles. The state machine data at the failing cycle is then scanned out by IC tester 14 and utilized to generate a bit-fail map for use in failure analysis.

The principal shortcoming of the closed-loop BIST testing methodology illustrated in FIG. 1 is the inability of IC tester 14 to test memory array 18 at typical operating speeds of fast memories (e.g., 200 MHz). Operating at 200 MHz necessitates that IC tester 14 monitor DGO signal 20 at least every 5 ns in order to capture the cycle number in which the failure of interest occurs. However, because of I/O gate delays and signal propogation delays of 1 ns/ft, the feedback provided by DGO signal 20 is too slow to indicate the cycle in which the failure of interest occurs and then stop the clocks to the BIST state machine to capture failure information.

Consequently, it would be desirable to provide an improved method and BIST apparatus for testing an integrated circuit. In particular, it would be desirable to provide a high-speed BIST apparatus and method for testing an integrated circuit which capture BIST state machine information at a selected failing cycle.

SUMMARY OF THE INVENTION

It is therefore one object of the present invention to provide an improved method and apparatus for testing an integrated circuit.

It is another object of the present invention to provide an improved method and built-in self-test apparatus for testing an integrated circuit.

It is yet another object of the present invention to provide an improved method and built-in self-test apparatus for testing an integrated circuit which capture failure information for a selected failure.

The foregoing objects are achieved as is now described. A built-in self-test (BIST) apparatus and method for testing an integrated circuit are disclosed which enable capture of failure data for a selected failure. The BIST apparatus comprises a clock generator, which generates at least a first clock signal, and a built-in self-tester, which applies predetermined input data patterns to the integrated circuit in response to the first clock signal. In addition, the BIST apparatus includes a data comparator for comparing output data received from the integrated circuit with expected output data. The data comparator detects a failure within the integrated circuit when the output data received from the integrated circuit differs from the expected output data. The BIST apparatus further includes a clock controller that disables the first clock signal in response to the detection of a selected occurrence of a failure. By enabling testing of the integrated circuit to be halted upon the occurrence of a selected failure, failure analysis of the integrated circuit is enhanced.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 2:
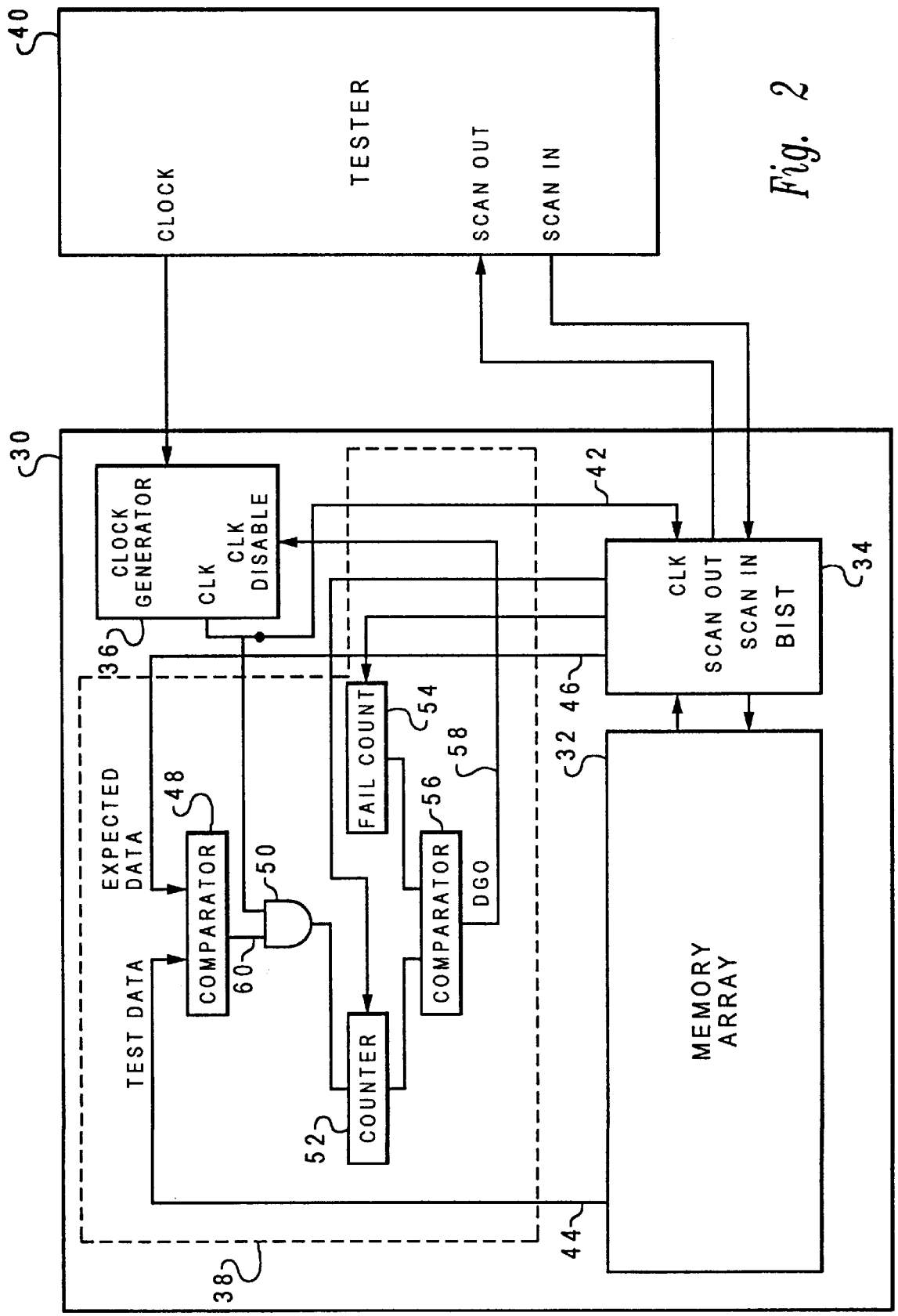
FIG. 2 depicts a preferred embodiment of the open-loop BIST testing apparatus of the present invention.

With reference now to the figures and in particular with reference to FIG. 2, there is depicted a preferred embodiment of the open-loop built-in self-test (BIST) integrated circuit testing apparatus of the present invention. As illustrated, integrated circuit 30, which in the depicted embodiment is a integrated circuit memory, comprises memory array 32, BIST 34, clock generator 36, and clock control logic 38. As will be understood by those skilled in the art, memory array 32 comprises a number of individual memory cells which are each accessed for reading or writing data by selecting particular word and bit lines. According to the present invention, the memory cells, word lines, and bit lines within memory array 32 are tested for defects utilizing BIST 34.

BIST 34 implements a testing state machine that tests memory array 32 based upon intial settings scanned in by tester 40. According to a preferred embodiment of the present invention, the state machine within BIST 34 includes a data pattern generator which produces a selected one of a number of test data patterns based upon the initial state machine settings. In addition, the state machine comprises a control signal generator that supplies the control signals and address data required to access each memory location within memory array 32. BIST 34 further includes an address register that indicates the address of the current memory location being accessed within memory array 32. After BIST 34 is initialized by tester 40, BIST 34 applies the selected test data pattern and address data to memory array 32 in response to BIST clock 42. Output test data 44 is subsequently read out from memory array 32 for comparison with expected data 46. As will be understood by those skilled in the art and embodiments of the present invention in which IC 30 comprises a memory, expected data 46 is also generated by the data pattern generator within BIST 34. In alternate embodiments of the present invention in which IC 30 is a logic circuit, the state machine within BIST 34 will also include an expected data pattern generator. Finally, BIST 34 includes facilities which enable the state of clock control logic 38 and the state machine within BIST 34 to be scanned out to tester 40, which utilizes the scanned data to generate a bit-fail map for use in failure analysis. Further details of this preferred embodiment of BIST 34 may be found in U.S. Pat. No. 5,173,906 to Dreibelbis et al., which is hereby incorporated by reference. However, those skilled in the art will appreciate that other BIST designs may also be advantageously employed.

Figure 1:
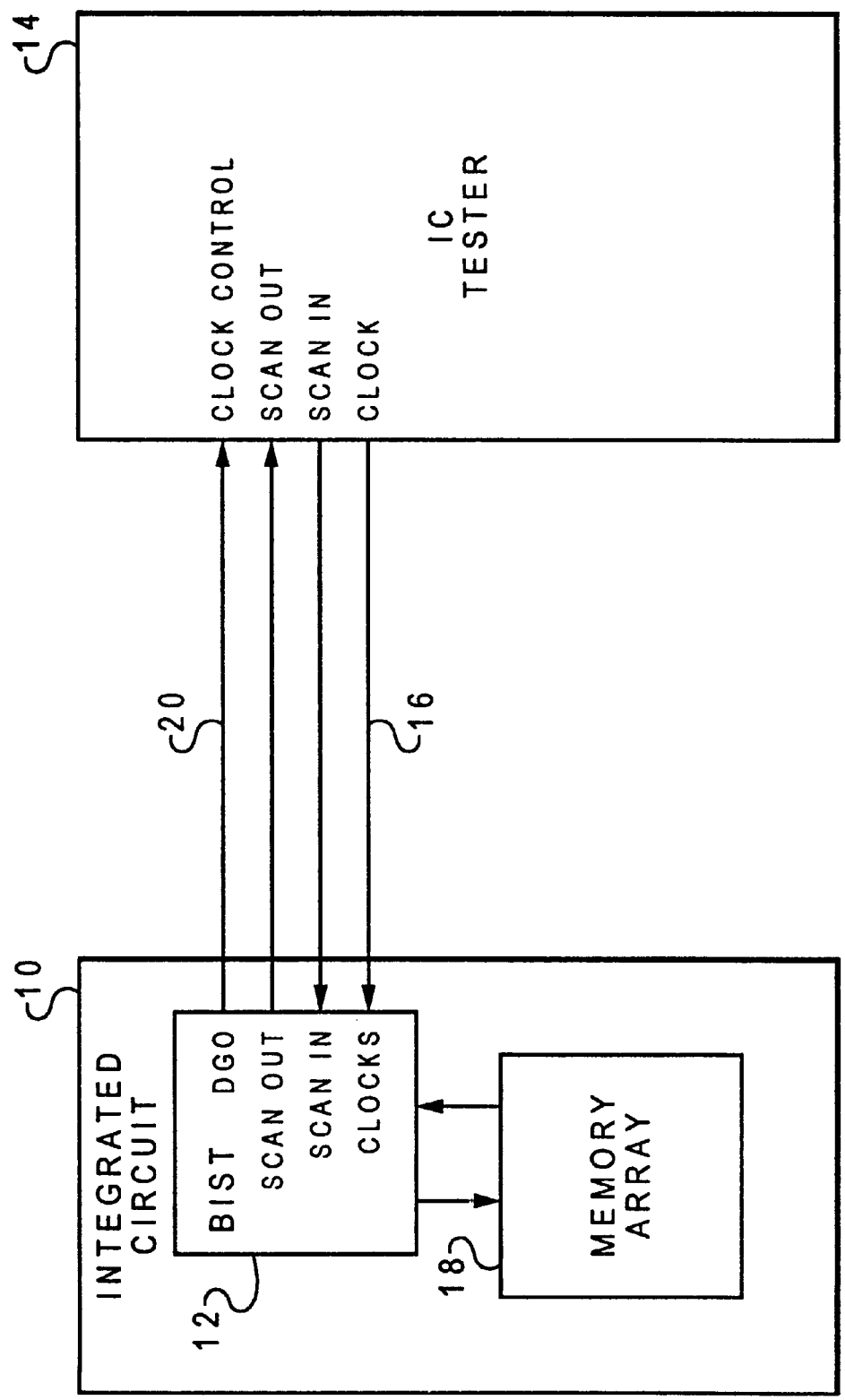
FIG. 1 illustrates a conventional BIST testing apparatus which employs a closed-loop testing methodology.

In contrast to the prior art BIST apparatus illustrated in FIG. 1, the preferred embodiment of the present invention depicted in FIG. 2 includes clock generator 36, which generates BIST clock 42 in response to a free-running clock signal received from tester 40. As illustrated, the clock signals generated by clock generator 36, including BIST clock 42, are disabled when diagnostic output (DGO) signal 58 is asserted. Because the operation of clock generator 36 is controlled on-chip rather than through a feedback loop to tester 40, the BIST apparatus illustrated in FIG. 2 is said to employ an open-loop diagnostic methodology.

According to an important aspect of the present invention, IC 30 includes clock control logic 38, which disables clock signals generated by clock generator 36 in response to the detection of a selected failure within memory array 32. As illustrated, clock control logic 38 includes comparators 48 and 56, AND gate 50, counter 52, and fail count register 54. Prior to testing memory array 32, counter 52, which indicates the number of failures detected, is initialized to a value scanned in by tester 40, for example, all 1's. In addition, fail count register 54 is initialized to the failure number of interest. For example, fail count register 54 is initialized to all 0's for the first failure, 001 for the second failure, 010 for the third failure, etc. During testing of memory array 32, test data 44 is read out from memory array 32 and compared with expected data 46 by comparator 40. In response to a discrepancy between test data 44 and expected data 46, failure signal 60 increments counter 52 when BIST clock signal 42 is also asserted. Comparator 56 then compares the value of counter 52 to the value stored within fail count register 54. In response to counter 52 reaching the number of failures indicated within fail count register 54, comparator 56 asserts DGO signal 58 to disable clock generator 36. Because the state of the scan chain, including the BIST address register which selects the currently accessed address, is preserved by disabling BIST clock signal 42 at the selected failure, tester 40 can generate a bit-fail map to pinpoint the source of the selected failure within memory array 32. Thus, a manufacturing engineer can readily determine whether the source of a particular failure is a single cell, word line, or bit line. Utilizing such specific information, manufacturing steps can be optimized to prevent further similar defects and consequently increase yield.

Figure 3:
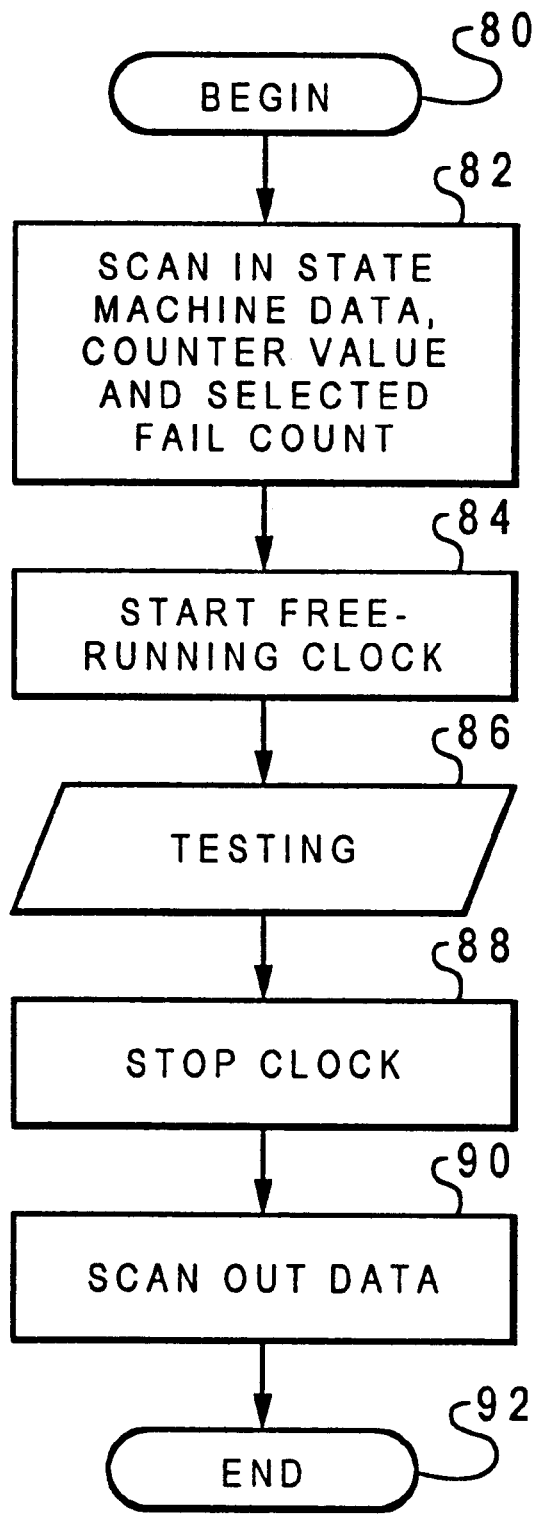
FIG. 3 is a flowchart illustrating a preferred embodiment of the method utilized by the present invention to test an integrated circuit.

Referring now to FIG. 3, there is illustrated a flowchart of a preferred embodiment of the method for testing an integrated circuit according to the present invention. As illustrated, the process begins at block 80 and thereafter proceeds to block 82, which illustrates tester 40 scanning initial BIST state machine settings, the initial value of counter 52, and the selected value of fail count register 54 into IC 30. The process then proceeds to block 84, which illustrates tester 40 transmitting a free-running clock signal to clock generator 36. The free-running clock signal is transmitted to clock generator 36 for a sufficient amount of time for BIST 34 to apply the complete test data pattern set specified by the intial state machine settings to memory array 32.

Next, the process proceeds to block 86, which illustrates BIST 34 testing memory array 32 as indicated by the parameters scanned in by tester 40. Thus, as described above, BIST 34 applies the selected test data pattern and address data to memory array 32 until BIST clock signal 42 is disabled upon the occurrence of a selected failure. If the selected number of failures are not detected, BIST 34 simply tests memory array 32 until the test data pattern is complete. The process then proceeds to blocks 88 and 90, which depict tester 40 disabling the free-running clock signal and scanning out data from BIST 34. Tester 40 then utilizes the scanned data to construct a bit-fail map for failure analysis. Thereafter, the process terminates at block 92.

As has been described, the present invention provides an improved method and BIST apparatus for testing an integrated circuit, which enable the state of the scan chain to be preserved at a selected failure. Because the BIST clock signal is gated internally, the present invention enables testing at significantly higher speeds than when utilizing a conventional closed-loop diagnostic methodology.

While the invention has been particularly shown and described with reference to a preferred embodiment, it will be understood by those skilled in the art that various changes in form and detail may be made therein without departing from the spirit and scope of the invention.

What is claimed is:

1. An apparatus for testing an integrated circuit having a built-in self-test circuit, said apparatus comprising:
   a semiconductor substrate having an electrical circuit formed therein;
   a testing device external to said semiconductor substrate, wherein said external testing device generates a free-running clock signal;

a clock generator within said semiconductor substrate, wherein said clock generator is coupled to said external testing device and generates at least a first clock signal in response to receipt of said free-running clock signal;

a built-in self-tester within said semiconductor substrate, wherein said built-in self-tester applies predetermined input data patterns to said electrical circuit in response to said first clock signal;

a data comparator within said semiconductor substrate for comparing output data received from said electrical circuit with expected output data, wherein said data comparator includes means for indicating an error when said output data received from said electrical circuit and said expected output data differ; and a clock controller within said semiconductor substrate and coupled to said means for indicating an error, said clock controller including means for specifying a selected occurrence of an error and means, responsive to indication of said selected occurrence of an error, for disabling said first clock signal, wherein said free-running clock signal remains active after said first clock signal is disabled.

2. The integrated circuit of claim 1, wherein said electrical circuit comprises a memory.

3. The integrated circuit of claim 2, said built-in self-tester including an address register that indicates a current address being accessed within said memory, wherein following said disabling of said first clock signal, said address register indicates a particular address within said memory accessed when said selected occurrence of an error was detected.

4. The integrated circuit of claim 1, wherein said means for specifying a selected occurrence of an error comprises a register and said clock controller further comprises:

an error counter which increments in response to each detection of an error by said data comparator; and a comparator which compares a value within said error counter and said selected occurrence stored within said register, wherein said comparator disables said first clock signal in response to a determination that said value within said error counter is equal to said selected occurrence stored within said register.

5. The integrated circuit of claim 4, wherein said clock generator generates a second clock signal that is disabled in response to a determination that said value within said error counter is equal to said selected occurrence stored within said register, and wherein said counter increments in response to each detection of an error by said data comparator only if said second clock is enabled.

6. The integrated circuit of claim 1, and further comprising:

a plurality of latches which contain test information, wherein said information contained within said latches is utilized to determine a source of said selected occurrence of an error within said electrical circuit.

7. A method for testing an electrical circuit formed within a substrate of an integrated circuit utilizing a built-in self-test (BIST) circuit, said method comprising:

specifying a selected occurrence of an error;

generating a free-running clock signal utilizing a testing device external to said substrate;

generating a first clock signal utilizing a clock generator within said substrate, wherein said first clock signal is generated in response to said free-running clock signal;

applying predetermined input data patterns to said electrical circuit in response to said first clock signal;

comparing output data received from said electrical circuit with expected output data, wherein an error is detected when said output data received from said electrical circuit and said expected output data differ; and disabling said first clock signal in response to a detection of said selected occurrence of an error, wherein said free-running clock signal remains active after said first clock signal is disabled.

8. The method for testing an electrical circuit of claim 7, said integrated circuit including an error counter which increments in response to each detection of an error and a register for storing said selected occurrence of an error, wherein said disabling step comprises:

comparing a value within said error counter and said selected occurrence stored within said register; and disabling said first clock signal in response to a determination that said value within said error counter is equal to said selected occurrence stored within said register.

9. The method for testing an electrical circuit of claim 8, and further comprising:

generating a second clock signal, wherein said error counter is incremented in response to a detection of an error only if said second clock is enabled; and disabling said second clock signal in response to a determination that said value within said error counter is equal to said selected occurrence stored within said register.

10. The method for testing an electrical circuit device of claim 7, said integrated circuit having a plurality of latches which contain test information, said method further comprising:

thereafter, reading said test information contained within said plurality of latches.

11. The method for testing an electrical circuit device of claim 7, wherein said electrical circuit comprises a memory, said integrated circuit including an address register that indicates a current address being accessed within said memory, wherein following said disabling of said first clock signal, said address register indicates a particular address within said memory accessed when said selected occurrence of an error was detected.

* * * * *